United States Patent
Lin et al.

(10) Patent No.: US 6,548,856 B1
(45) Date of Patent: Apr. 15, 2003

(54) VERTICAL STACKED GATE FLASH MEMORY DEVICE

(75) Inventors: Chrong-Jung Lin, Hsin Tien (TW); Shui-Hung Chen, Hsin-Chu (TW); Mong-Song Liang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 80 days.

(21) Appl. No.: 09/583,403

(22) Filed: May 31, 2000

Related U.S. Application Data

(62) Division of application No. 09/035,049, filed on Mar. 5, 1998, now Pat. No. 6,093,606.

(51) Int. Cl.[7] .................................. H01L 29/788
(52) U.S. Cl. .................. 257/315; 257/323; 438/259
(58) Field of Search ....................... 257/315, 321; 438/259

(56) References Cited

U.S. PATENT DOCUMENTS

| | | | |
|---|---|---|---|
| 5,108,938 A | 4/1992 | Solomon | 437/41 |
| 5,210,047 A | 5/1993 | Woo et al. | 437/43 |
| 5,229,310 A | 7/1993 | Sivan | 437/41 |
| 5,312,767 A | 5/1994 | Shimizu et al. | 437/40 |
| 5,391,506 A | 2/1995 | Tada et al. | 437/41 |
| 5,460,988 A * | 10/1995 | Hong | 438/259 |
| 5,460,989 A * | 10/1995 | Wake | 438/259 |
| 5,506,431 A * | 4/1996 | Thamos | 368/185.15 |
| 5,705,415 A * | 1/1998 | Orlowski et al. | 438/585 |
| 5,945,705 A * | 8/1999 | Liu et al. | 257/315 |

\* cited by examiner

*Primary Examiner*—Wael Fahmy
*Assistant Examiner*—Howard Weiss
(74) *Attorney, Agent, or Firm*—George O. Saile; Stephen B. Ackerman; Graham S. Jones, II

(57) ABSTRACT

A method of forming a vertical transistor memory device comprises the following process steps. Before forming the trenches, FOX regions are formed between the rows. Then form a set of trenches with sidewalls and a bottom in a semiconductor substrate with threshold implant regions the sidewalls. Form doped drain regions near the surface of the substrate and doped source regions in the base of the device below the trenches with oppositely doped channel regions therebetween. Form a tunnel oxide layer over the substrate including the trenches. Form a blanket thin floating gate layer of doped polysilicon over the tunnel oxide layer extending above the trenches. Etch the floating gate layer leaving upright floating gate strips of the floating gate layer along the sidewalls of the trenches. Form an interelectrode dielectric layer composed of ONO over the floating gate layer and over the tunnel oxide layer. Form a blanket thin control gate layer of doped polysilicon over the interelectrode dielectric layer. Pattern the control gate layer into control gate electrodes. Form spacers adjacent to the sidewalls of the control gate electrode.

3 Claims, 7 Drawing Sheets

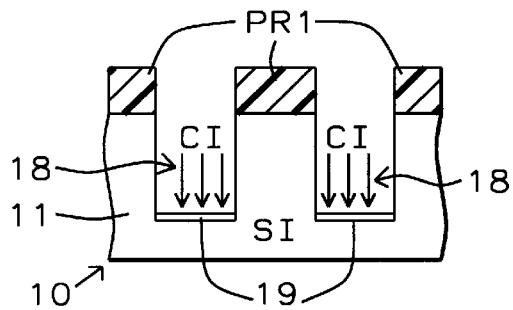
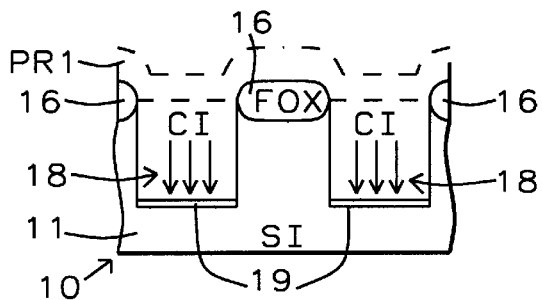
FIG. 1E  FIG. 2E
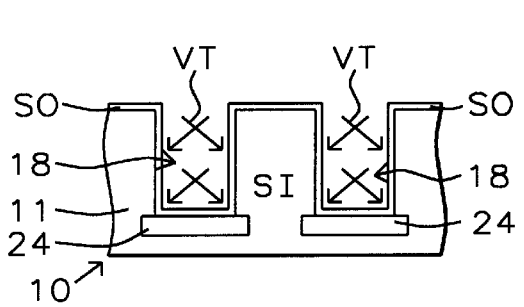
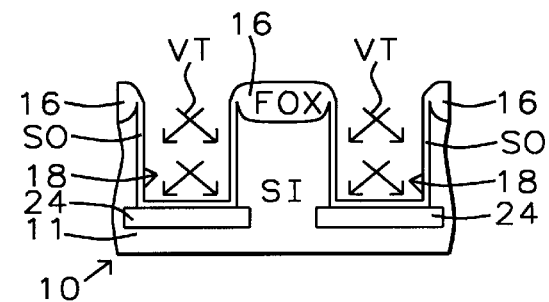
FIG. 1F  FIG. 2F
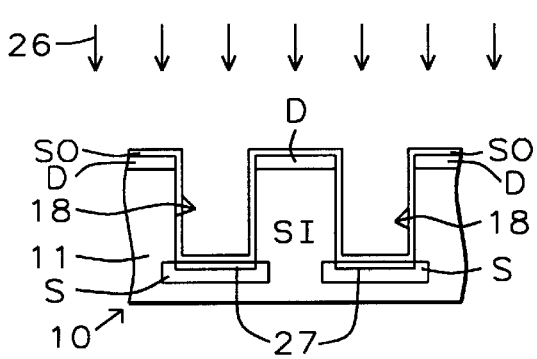
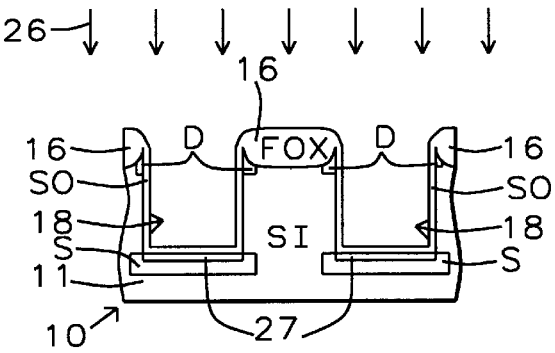
FIG. 1G  FIG. 2G

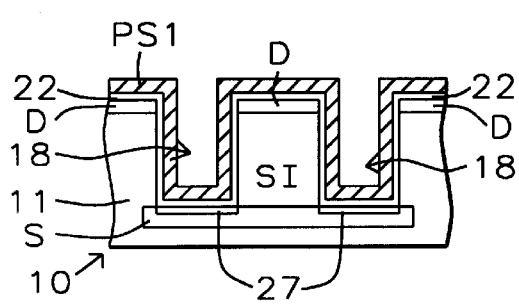
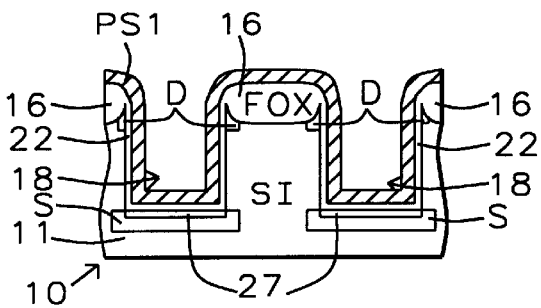
FIG. 1H  FIG. 2H
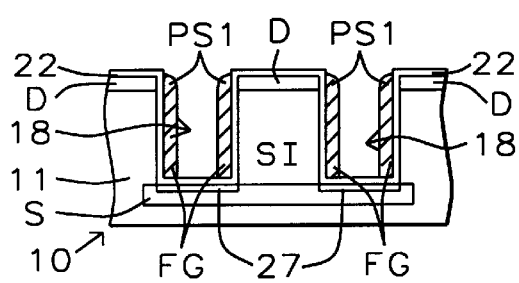
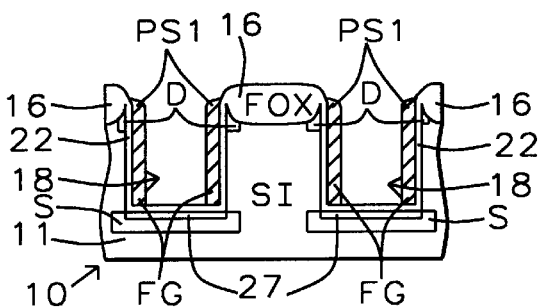
FIG. 1I  FIG. 2I
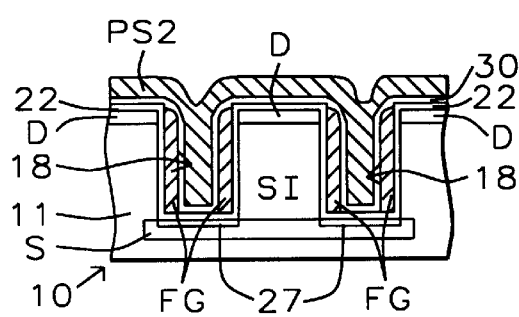
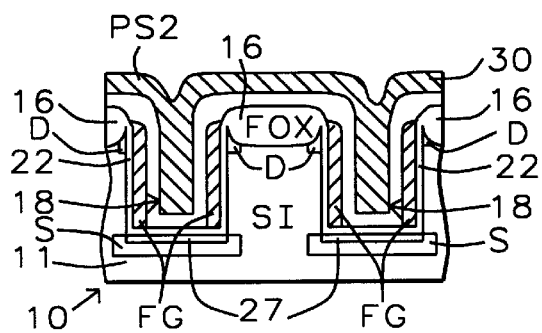
FIG. 1J  FIG. 2J

VERTICAL STACKED GATE FLASH MEMORY DEVICE

This is a division of patent application Ser. No. 09/035,049, filing date Mar. 5, 1998, now U.S. Pat. No. 6,093,606 Method Of Manufacture Of Vertical Stacked Gate Flash Memory Device And Device Manufactured Thereby, assigned to the same assignee as the present invention.

BACKGROUND OF THE INVENTION

1. Field of the Invention

This invention relates to the manufacture of semiconductor memory devices and more particularly to a method of manufacture of vertical FET devices formed in trenches in a semiconductor substrate and the devices formed thereby.

2. Description of Related Art

Some background information is as follows:

1. It is necessary to employ process steps which are different from conventional processes to scale down for deep sub-micron devices.
2. There is an issue of compatibility in embedded flash memory devices.
3. There has been low drain current in the past.

U.S. Pat. No. 5,108,938 of Solomon for "Method of Making a Trench Gate Complimentary Metal Oxide Semiconductor Transistor" shows a FET (Field Effect Transistor) with the source (S) and drain (D) regions on the substrate surface separated by a trench.

U.S. Pat. No. 5,391,506 of Tada et al. for "Manufacturing Method for Semiconductor Devices with Source/Drain Formed in Substrate Projection" shows a method for manufacturing semiconductor devices with source/drain regions formed in a substrate projection. A projection is formed in a substrate by anisotropic etching and a transistor is contained in the projection. The central portion of the projection covered with a gate electrode is formed as a channel region, and drain/source regions are formed on both sides of the projection by oblique ion implantation with the gate electrode as a mask.

U.S. Pat. No. 5,312,767 of Shimizu et al, for "MOS Type Field Effect Transistor and Manufacturing Method Thereof" shows a vertical SOI (Silicon On Insulator) transistor that has the S and D regions on opposite ends of a trench. However the device is not a Flash memory device.

U.S. Pat. No. 5,229,310 of Sivan "Method of Making a Self-Aligned Vertical Thin-Film Transistor in a Semiconductor Device" shows an EEPROM with a vertical orientation in a trench.

See Woo et al. U.S. Pat. No. 5,210,047 for "Process for Fabricating a Flash EPROM Having Reduced Cell Size".

SUMMARY OF THE INVENTION

Objects of this invention are as follows:

1. Use vertical channel and drain/source structure to reduce cell area substantially.
2. Use trench floating polysilicon method to planarize front gate topography in a way which is fully compatible with logic manufacturing process.
3. Increase drain current by providing a large conductive width of the structure.

Features of the present invention are as follows:

1. An area scale down is more possible than in the past.
2. Gate patterning and planarization are very compatible with the logic circuit manufacturing process.
3. High drain current is available during programming and reading.

In accordance with this invention a method is provided for forming a vertical transistor memory device by a process with the following steps. Before forming the trenches, FOX regions are formed between the rows. Then form a set of trenches with sidewalls and a bottom in a semiconductor substrate with threshold implant regions the sidewalls. Form doped drain regions near the surface of the substrate and doped source regions in the base of the device below the trenches with oppositely doped channel regions therebetween. Form a tunnel oxide layer over the substrate including the trenches. Form a blanket thin floating gate layer of doped polysilicon over the tunnel oxide layer extending above the trenches. Etch the floating gate layer leaving upright floating gate strips of the floating gate layer along the sidewalls of the trenches. Form an interelectrode dielectric layer composed of ONO over the floating gate layer and over the tunnel oxide layer. Form a blanket thin control gate layer of doped polysilicon over the interelectrode dielectric layer. Pattern the control gate layer into control gate electrodes. Form spacers adjacent to the sidewalls of the control gate electrode.

Preferably, an array of FET cells is formed in rows and columns, with the rows being orthogonally arranged with respect to the columns with the cells in a single row having a common source region and the cells in columns having separate source regions. Prior to forming the threshold implant regions formed within the trench sidewalls, a source connect implant is formed in the bottoms of the trenches. Before forming the trenches, FOX regions are formed between the rows.

In accordance with this invention, a vertical stack gate flash memory device is provided made in accordance with the above method.

BRIEF DESCRIPTION OF THE DRAWINGS

The foregoing and other aspects and advantages of this invention are explained and described below with reference to the accompanying drawings, in which:

FIGS. 1A–1L show sectional elevational views of a device in accordance with this invention, taken along line 4–4' in FIG. 3, in the stages of the process for producing a device in accordance with this invention.

FIGS. 2A–2L show sectional elevational views of a device in accordance with this invention, taken along line 5–5' in FIG. 3, of various stages of the process for producing a device in accordance with this invention.

FIG. 3 shows a plan sectional view of the device of FIGS. 1L and 2L as well as FIGS. 4 and 5 taken along line 3–3' in FIG. 4.

FIG. 4 shows a sectional view of the device of FIG. 3 taken along line 4–4' in FIG. 3 showing the direction of flow through the channel region between the source region and the drain regions.

FIG. 5 shows a sectional view of the device 10 of FIG. 3 taken along line 5–5' in FIG. 3 showing the direction of flow through the channel region between the source and the drain regions with a control gate bridging across a column from row to row.

FIG. 6 shows a plan sectional view of the device of FIGS. 7 and 8 taken along line 6–6' in FIG. 7, which is a modification of the device seen in FIG. 3.

FIG. 7 shows a sectional view of the device of FIG. 6 taken along line 7–7' in FIG. 6 showing the flow through the channel region between the source and the drain regions, which is a modification of the device seen in FIG. 4.

FIG. 8 shows a sectional view of the device 10 of FIG. 6 taken along line 8–8' in FIG. 6 showing the flow through the channel region between the source region and the drain regions with a control gate bridging across a column from row to row, which is a modification of the device seen in FIG. 5.

DESCRIPTION OF THE PREFERRED EMBODIMENT

Figure 1A:
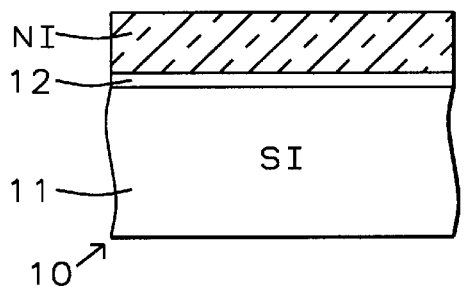
Figure 2A:
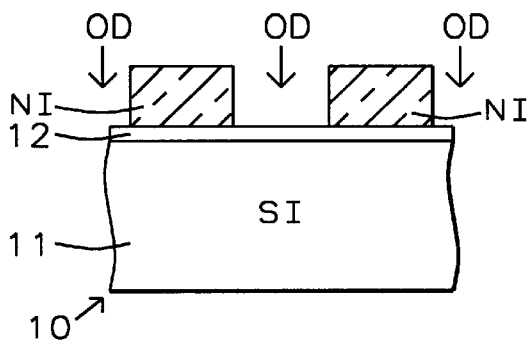
Figure 2B:
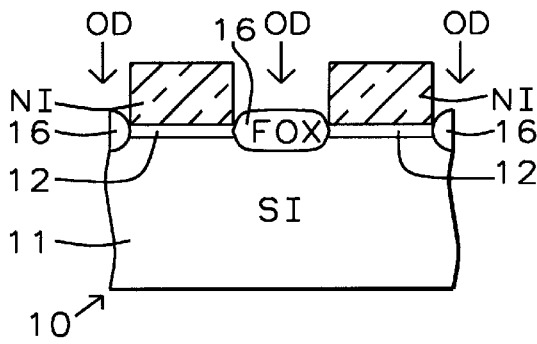
Figure 2C:
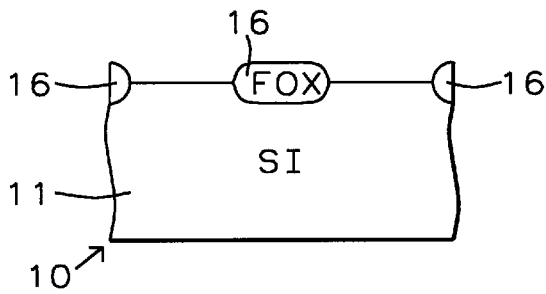
Figure 2D:
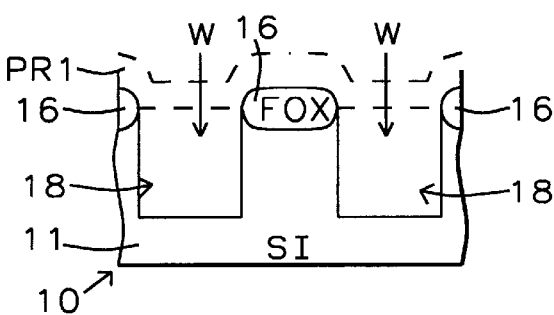
Figure 2K:
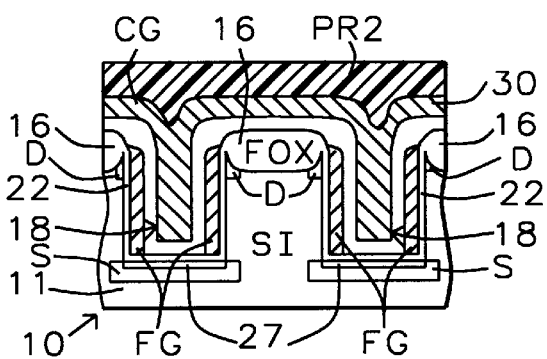
Figure 2L:
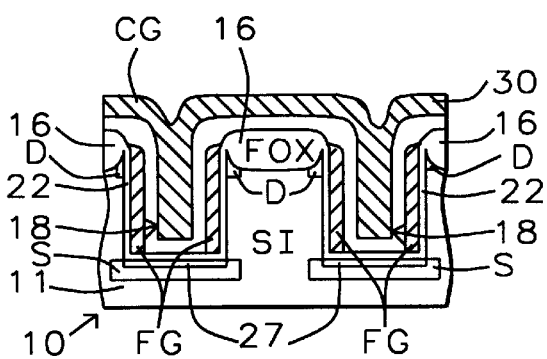
Figure 3:
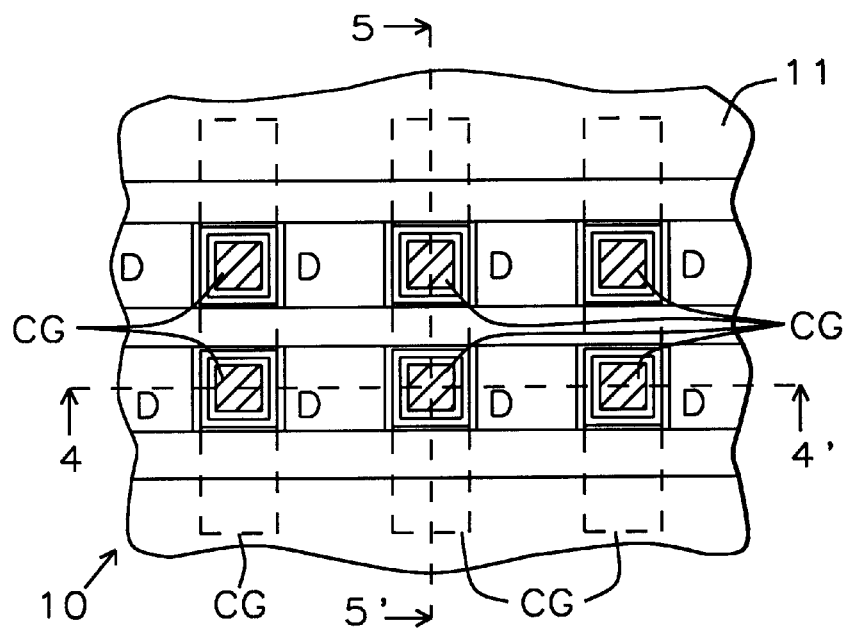
FIGS. 3–5 describe a device in accordance with this invention with a self-aligned drain.

FIGS. 1A–1L show sectional elevational views of a device 10 in accordance with this invention, taken along line 4–4' in FIG. 3, of various stages of the manufacturing process for producing a device in accordance with this invention. FIGS. 2A–2L show sectional elevational views of a device 10 in accordance with this invention, taken along line 5–5' in FIG. 3, of various stages of the manufacturing process for producing a device in accordance with this invention. FIGS. 1A and 2A show the device 10 after the first and second steps of the process.

1. Wafer Start

The first step is the "wafer start step" in which a silicon semiconductor substrate 11 is provided.

2. Active Area Definition

The second step is definition of the "active area (OD) in a Pad oxide/Nitride Deposition step in which a thin pad oxide layer 12 and a silicon nitride mask NI with OD openings therethrough have been applied to substrate 11.

3. Field Oxidation

Figure 1B:
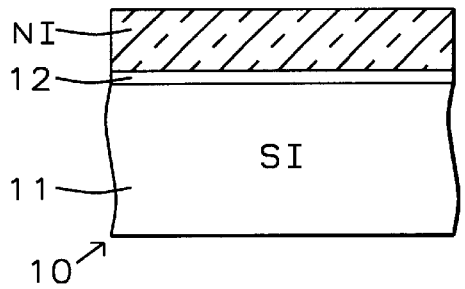

FIGS. 1B and 2B show the device 10 after the third step in which a conventional field oxidation process has formed the FOX (Field OXide) regions 16, as shown in FIG. 2B.

4. Stripping Nitride Mask and Pad Oxide Layer

Figure 1C:
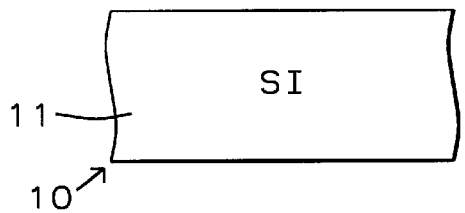

FIGS. 1C and 2C show the device 10 after the fourth step in which the silicon nitride mark NI has been stripped from device 10. In addition, in this step, the pad oxide layer 12 has been stripped from device 10.

5. Trench Channel Etch

Figure 1D:
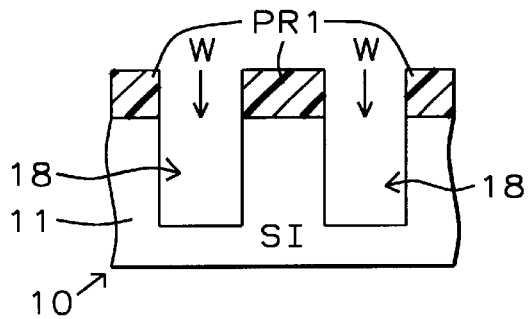

FIGS. 1D and 2D show the device 10 after the fifth step in which photoresist trench mask PR1 was formed over device 10 including the FOX regions 16 and the exposed surfaces of substrate 11. Mask PR1 has a set of windows W therethrough down to the top surface of substrate 11. Windows W were then used to etch trenches 18 into the substrate 11 from about 3,000 Å to about 9,000 Å deep. Trenches 18 have a width from about 3,000 Å to about 10,000 Å across the page and a length from about 3,000 Å to about 10,000 Å extending back into the page. Vertical transistors are formed in the trenches 18. Trenches 18 are etched by a dry process such as RIE (Reactive Ion Etching) or plasma etching.

6. Source Connection Region Implant

FIGS. 1E and 2E show the device 10 after the sixth step in which P type dopant CI is implanted, in an anisotropic vertical implant, into the base regions 19 of the trenches 18 to provide a source connection implant.

The source connection region 19 was ion implanted into formed by ion implanting into substrate 10 at the base of trench 18 with a dose of phosphorus N type dopant from about $1\times10^{14}$ ions/cm$^2$ to about $3\times10^{15}$ ions/cm$^2$ at an energy from about 20 keV to about 60 keV. After annealing the concentration of phosphorus dopant in source connection region 19 ranged from about $1\times10^{19}$ atoms/cm$^3$ to about $4\times10^{20}$ atoms/cm$^3$.

7. Sacrificial Oxide

Referring to FIGS. 1F and 2F, device 10 is shown after a SAC (Sacrificial) oxide layer SO was formed over the exposed surfaces of silicon substrate 11, aside from FOX regions 16, covering the substrate 11 and the sidewalls and bottom of the trenches 18 with a thin silicon oxide film with a thickness from about 100 Å to about 250 Å.

8. Threshold Voltage Implant

Referring again to FIGS. 1F and 2F, following formation of the SAC layer SO, a Vth (Threshold Voltage) rotary oblique angular ion implant of boron difluoride BF$_2$ P type dopant for the channel regions of the FET devices to be formed is implanted in the exposed surfaces of the substrate 10, especially including the sidewalls of the trenches 18. The FOX regions 16 in FIG. 2F prevent ion implantation into the surfaces the substrate 11 below them.

The sidewalls of the trenches 18 in substrate 11 were ion implanted at an oblique angle with a dose of BF$_2$ dopant from about $1\times10^{12}$ ions/cm$^2$ to about $7\times10^{13}$ ions/cm$^2$ at an energy from about 15 keV to about 45 keV. After annealing the concentration of the boron dopant in the sidewalls of the substrate 11 was from about $8\times10^{16}$ atoms/cm$^3$ to about $8\times10^{17}$ atoms/cm$^3$.

9. Source/Drain Implant

Referring again to FIGS. 1H and 2H, device 10 is shown after a tunnel oxide layer 22 was formed over the exposed surfaces of silicon substrate 11, aside from FOX regions 16 covering the substrate 11 and the sidewalls and bottom of the trenches 18 with a thin silicon oxide film with a thickness from about 70 Å to about 150 Å.

The source/drain regions S and D were ion implanted with a dose of arsenic, phosphorus or antimony N type dopant from about $5\times10^{14}$ ions/cm$^2$ to about $5\times10^{15}$ ions/cm$^2$ at an energy from about 20 keV to about 45 keV. After annealing the concentration of arsenic, phosphorus or antimony N type dopant in the source/drain regions S/D were from about $5\times10^{19}$ atoms/cm$^3$ to about $5\times10^{20}$ atoms/cm$^3$. After the process of FIG. 1G, which includes annealing, the source connection region 27 extends across the gap between adjacent trenches 18. The doped drain regions D were formed in the substrate 11 juxtaposed with the tops of the trenches near the surface of the substrate 11. The doped source regions S were formed in the base of the substrate below bottoms of the trenches 18.

The connect regions 27 are shown at the base of the trenches below the sacrificial oxide layer SO.

10. Stripping Sacrificial Oxide Layer

Referring to FIGS. 1H and 2H, the next step is to strip the sacrificial oxide layer SO from the device 11.

11. Tunnel Oxide

Referring again to FIGS. 1H and 2H, device 10 is shown after a tunnel oxide layer 22 was formed over the exposed surfaces of silicon substrate 11 regions 16, aside from FOX regions covering the substrate 11 and the sidewalls and bottom of the trenches 18 with a thin silicon oxide film with a thickness from about 70 Å to about 150 Å.

The connect regions 27 are shown at the base of the trenches below the tunnel oxide layer 22.

12. Floating Polysilicon Deposition

Referring again to FIGS. 1H and 2H, device 10 is shown after a blanket, conformal, first polysilicon layer PS1 was formed over the device 11 covering the tunnel oxide layer 22 and FOX regions 16 and filling trenches 18 conformally with a large hollow space remaining in the trenches 18.

First, the thickness of polysilicon layer PS1 is from about 500 Å to about 2,000 Å. Polysilicon layer PS1 is doped with a conventional dopant to provide electrical conductivity as is conventional with polysilicon metallization.

13. Floating Polysilicon Etch

Referring to FIGS. 1I and 2I, device 10 is shown after the first polysilicon layer PS1 has been partially etched by an anisotropic vertical etch of the layer PS1 away from the top surface of device 10 and away from the bottom surface of the trenches 18, providing separate floating gate structures, i.e. thin floating gate strips FG, on the right sidewalls and the left sidewalls of the trenches 18. The thin floating gate strips FG extend from the bottoms to the proximate to the tops of the sidewalls of the trenches 18, just below the tops of the trenches 18. The thin floating gate strips FG are absent from the bottoms of the trenches 18 aside from the sidewalls of the trenches 18 except for the thickness of the thin floating gate strips FG. The thin floating gate strips FG extend from proximity to juxtaposition with the drain regions near the surface of the substrate 11.

Anisotropic vertical etching with RIE or plasma is used to etch until layer PS1 is lowered down to just below the top of the trenches 18 proximate to the tops of the trenches 18, with all of layer PS1 removed from the horizontal surface of tunnel oxide layer 22 aside from the sidewalls of the trenches, the substrate 11 and the FOX regions 16. As can be seen in FIGS. 1I and 2I, the layer PS1 remains along the sidewalls of the trenches 18. Layer PS1 forms upright floating gate strips FG of the floating gate layer PS1 along the sidewalls of the trenches 18.

14. Intergate Dielectric Deposition

Referring to FIGS. 1J and 2J, device 10 is shown after formation of a dielectric layer 30 which is thick enough to substantially fill the trench above the level of the top surface of the substrate 11 or above the floating gate strips FG.

Layer 30 is preferably an ONO (Oxide/Nitride/Oxide) layer. In that case layer 30 comprises thin layers of SiO/$Si_3N_4$/SiO forming a set of intergate (interpolysilicon) dielectric structures 30 with an overall thickness from about 150 Å to about 250 Å. The ONO layer 30 can be formed by the process steps as follows:

O Thermal oxide thickness of about 80 Å to about 150 Å at about 900 to 1000° C., N Nitride by LPCVD at 700–800° C. thickness of about 100 Å to about 150 Å, O thermal oxidation or CVD thickness of about 20–50 Å at about 900° C. for 10 minutes.

15. Control Polysilicon Deposition

Referring once more to FIGS. 1J and 2J, device 10 is shown after a second polysilicon layer PS2 was formed over the device 11 covering the interpolysilicon layer 30 nearly filling trenches 18 to provide a layer to be patterned into the control gate electrodes of the device 10. The second polysilicon layer PS2 has a thickness from about 1,500 Å to about 3,000 Å. The polysilicon layer PS2 is doped with a conventional dopant to provide electrical conductivity as is conventional with polysilicon metallization.

16. Control Polysilicon Mask

Figure 1K:
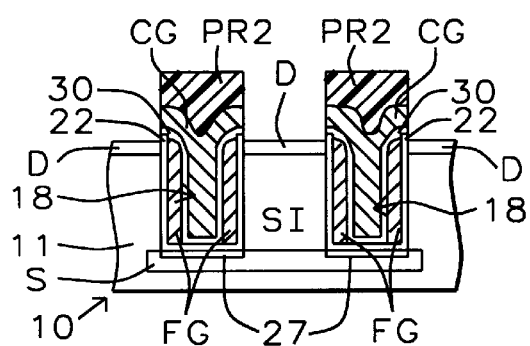

Referring to FIGS. 1K and 2K, device 10 is shown after formation of control gate mask PR2.

17. Control Polysilicon Etch

Referring to FIGS. 1K and 2K, device 10 is shown after the second polysilicon layer PS2 has been etched by RIE or plasma etching until layer PS2 has been patterned in the pattern of mask PR2 into the control gate electrodes CG.

18. Control Polysilicon Mask

Figure 1L:
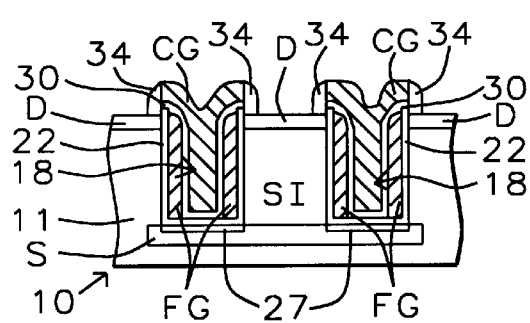

Referring to FIGS. 1L and 2L, device 10 is shown after stripping of control gate mask PR2 leaving the control gate electrodes CG exposed.

19. Spacer Glass Deposition

Then again referring to FIGS. 1L and 2L, a spacer glass layer 34 is formed over the entire device 10 covering the drain regions D, the exposed sidewalls of the ONO layer 30 and the control gates CG. A conventional TEOS process can be employed to form the glass spacer layer.

20. Spacer Etch

Finally, the spacer layer 34 is etched back to form the spacers 34 adjacent to the sidewalls of the ONO layer 30 and the control gate electrodes CG in the conventional manner.

Figure 4:
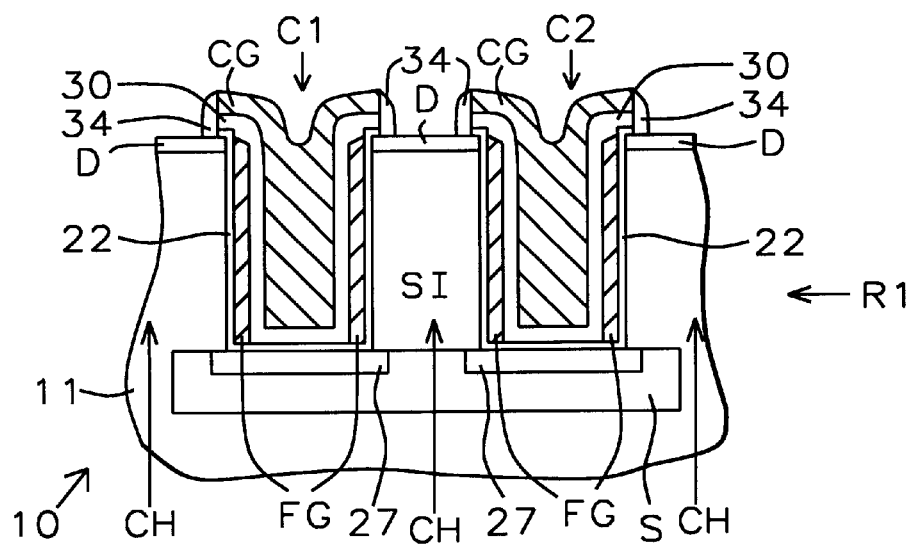
Figure 5:
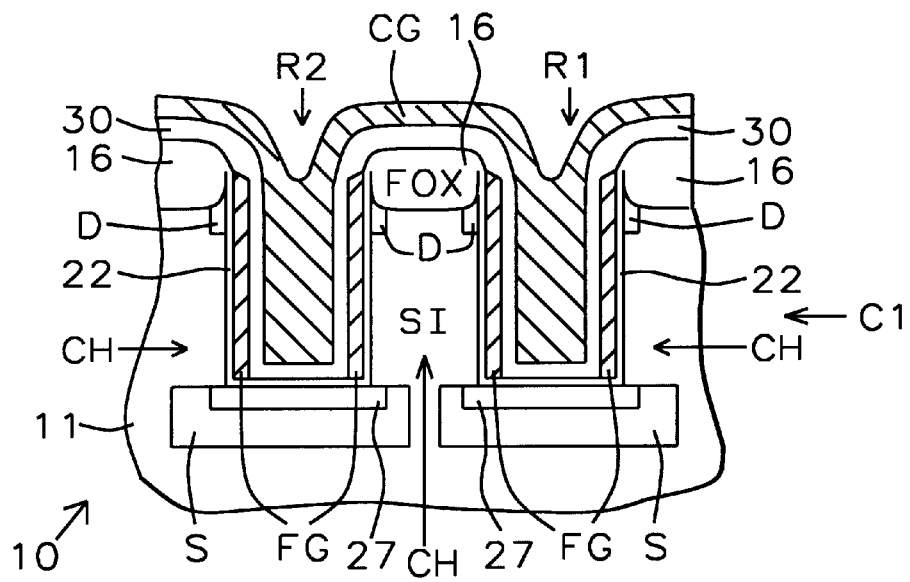

FIG. 3 shows a plan sectional view of the device 10 of FIGS. 1L and 2L as well as FIGS. 4 and 5 taken along line 3–3' in FIG. 4. Two horizontal rows R1 and R2 of three FET devices each are shown in three vertical columns C1, C2 and C3 with drain regions D located between the trenches indicated by the nested squares in the center square of which are the sections of the control gates CG surrounded by the ONO regions 30. Extending vertically are the portions of the control gates CG which are shown in phantom as they have been cut away by the section which looks below the surface of the device 10 with the tops of the control gates cut away to shown the ONO layers, etc. The spacers 34 are shown on the sidewalls of the control gates CG.

FIG. 4 shows a sectional view of the device 10 of FIG. 3 taken along line 4–4' in FIG. 3 showing the flow F through the channel region CH between the source region S and the drain region D. A single buried source line S extends along between the three FET devices in row R1. There is a parallel source line S extending along between the three FET devices in row R2.

FIG. 5 shows a sectional view of the device 10 of FIG. 3 taken along line 5–5' in FIG. 3 showing the flow F through the channel region CH between the source region S and the drain regions D with the control gate CG bridging across the column C2 from row R2 to row R1.

Figure 6:
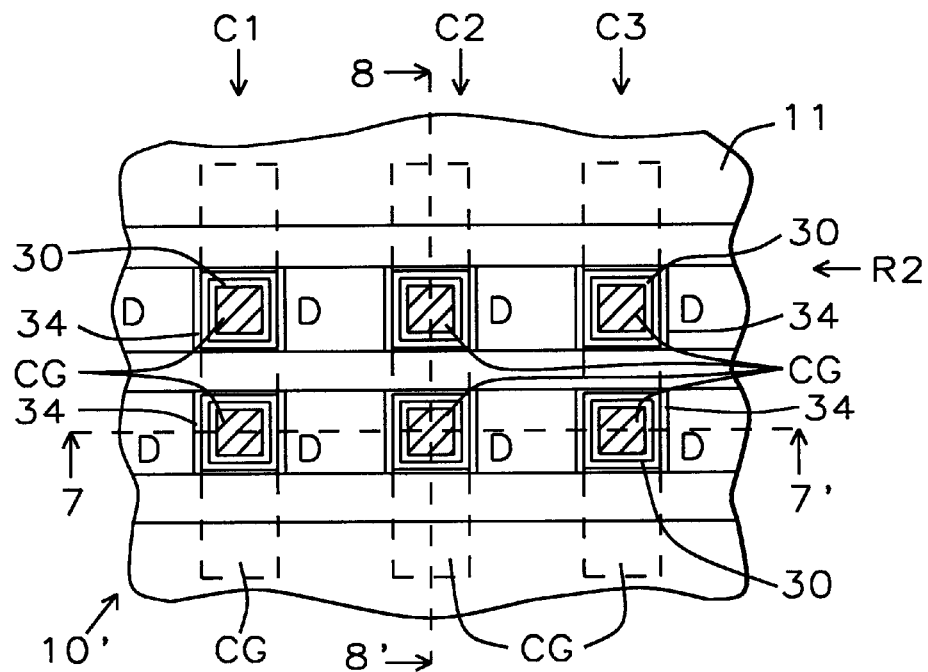
FIGS. 6–8 describe a device in accordance with this invention with a non-self-aligned drain.
Figure 7:
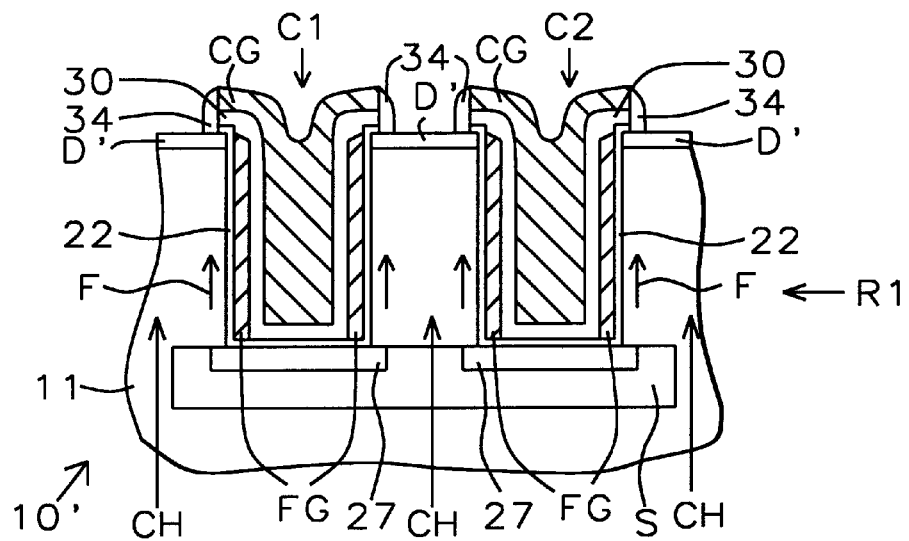
Figure 8:
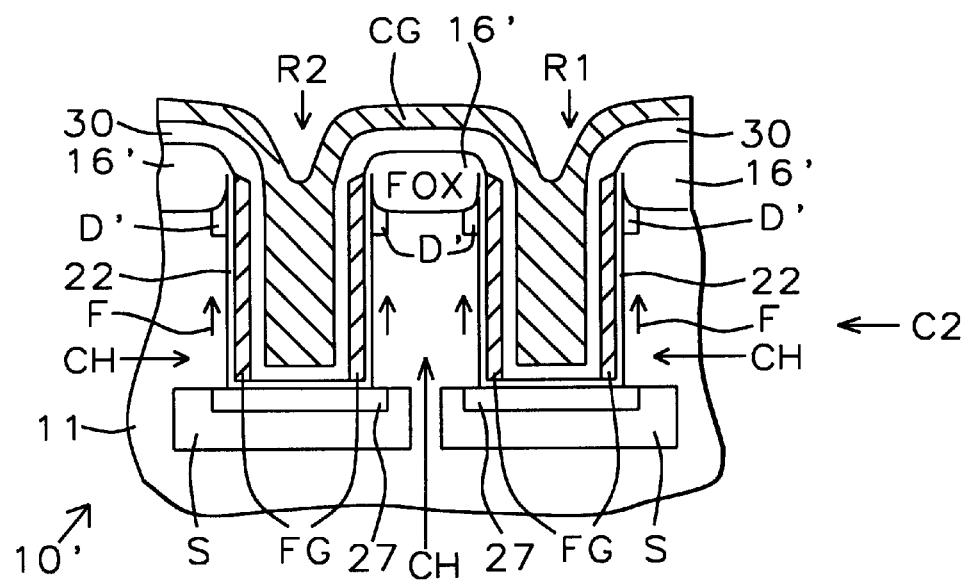

FIGS. 6–8 describe a device in accordance with this invention with a self-aligned drain.

FIG. 6 shows a plan sectional view of the device of FIGS. 7 and 8 taken along line 6–6' in FIG. 7, which is a modification of the device seen in FIG. 3.

FIG. 7 shows a sectional view of the device of FIG. 6 taken along line 7–7' in FIG. 6 showing the flow through the channel region between the source and drain regions, which is a modification of the device seen in FIG. 4.

FIG. 8 shows a sectional view of the device 10 of FIG. 6 taken along line 8–8' in FIG. 6 showing the flow through the channel region between the source region and the drain regions with a control gate bridging across a column from row to row, which is a modification of the device seen in FIG. 5.

For the operation modes, channel hot electron programming is employed. FN (Fowler Nordheim) tunneling erase used and reading is also done. The operation conditions of the memory cell are listed in Table I below.

TABLE I

|  | $V_S$ | $V_D$ | $V_{CG}$ | $V_B$ |
|---|---|---|---|---|
| Program | 0V | +4V ~ +6V | +8V ~ +15V | 0V |
| Erase | +5V ~ +8V | +5V ~ +8V | −8V ~ −15V | +5V ~ +8V |
| Read | 0V | 1.5V | +1.5V ~ +3.5V | 0V |

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A vertical transistor FET memory device comprising:

an array of FET cells formed in rows and columns, with the rows being orthogonally arranged with respect to the columns, with the cells in a single row having a common source region and with the cells in a column having separate source regions, a set of trenches each having trench sidewalls and a trench bottom in a semiconductor substrate, with threshold implant regions formed within the trench sidewalls, source connection regions formed in the substrate at the bottom of the trenches implanted with a first type of dopant, doped drain regions near the surface of the substrate juxtaposed with the trenches and doped source regions in the base of the device below the trenches with oppositely doped channel regions between the source regions and the drain regions, a tunnel oxide layer over the substrate including the sidewalls and covering the bottom of the trenches, a pair of thin floating gate strips of doped polysilicon formed over the tunnel oxide layer on both sides of the trenches extending from just below the tops of the trenches proximate to the tops of the trenches to the bottoms of the trenches and the thin floating gate strips being absent from the bottom of the trench aside from the bottoms of the sidewalls with the tunnel oxide located between the floating gate structures and the sidewalls of the trenches, the thin floating gate strips being in the form of upright thin floating gate strips along the sidewalls of the trenches, an interelectrode dielectric layer formed over the floating gate structures and the tunnel oxide layer, and a control gate layer of doped polysilicon over the interelectrode dielectric layer covering the interelectrode dielectric layer and filling the space in the trench between the thin floating gate strips.

2. A device in accordance with claim 1 with FOX regions formed between the rows.

3. A vertical transistor memory device with rows and columns of FET memory cells formed in and on a semiconductor substrate which has a surface, the device comprising:

an array of FET cells with rows and columns, with the rows being orthogonally arranged with respect to the columns, with the cells in a single row having a common source region and with the cells in a column having separate source regions, FOX regions formed between the rows in the surface of the substrate, a set of trenches with sidewalls and a bottom in a semiconductor substrate with threshold implant regions in the sidewalls, source connection regions formed in the substrate at the bottom of the trenches implanted with a first type of dopant, doped drain regions near the surface of the substrate juxtaposed with the trenches and doped source regions in the base of the device below the trenches with oppositely doped channel regions between the source regions and the drain regions, a tunnel oxide layer over the substrate including the sidewalls and the bottom of the trenches, a pair of thin floating gate strips of doped polysilicon formed over the tunnel oxide layer on both sides of the trenches with the tunnel oxide located between the floating gate structures and the sidewalls of the trenches, the thin floating gate layer being in the form of upright floating gate strips of the floating gate formed along the sidewalls of the trenches and just below the top of the trenches proximate to the drain regions at the tops of the trenches, an interelectrode dielectric layer composed of ONO over the floating gate structures and over the tunnel oxide layer, a thin control gate layer of doped polysilicon formed over the interelectrode dielectric layer and filling the space in the trench between the floating gate structures, the control gate layer patterned into control gate electrodes having sidewalls, and spacers adjacent to the sidewalls of the control gate electrodes formed over the drain regions.

\* \* \* \* \*